(12) United States Patent
Takagi (10) Patent No.: US 9,698,566 B1
(45) Date of Patent: Jul. 4, 2017

(54) OPTICAL MODULE

(71) Applicant: Mitsubishi Electric Corporation, Tokyo (JP)

(72) Inventor: Kazuhisa Takagi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/298,274

(22) Filed: Oct. 20, 2016

(30) Foreign Application Priority Data

Apr. 7, 2016 (JP) .................................. 2016-077037

(51) Int. Cl.
| H01S 5/00 | (2006.01) |
| H01S 5/0687 | (2006.01) |
| H01S 5/12 | (2006.01) |
| H01S 5/10 | (2006.01) |
| H01S 5/022 | (2006.01) |
| H01S 5/026 | (2006.01) |
| H01S 5/22 | (2006.01) |
| H01S 5/30 | (2006.01) |
| H01S 5/343 | (2006.01) |

(Continued)

(52) U.S. Cl.
CPC .......... *H01S 5/0687* (2013.01); *H01S 5/0261* (2013.01); *H01S 5/02252* (2013.01); *H01S 5/1025* (2013.01); *H01S 5/12* (2013.01); *H01S 5/22* (2013.01); *H01S 5/3054* (2013.01); *H01S 5/343* (2013.01); H01S 5/0625 (2013.01); H01S 5/50 (2013.01)

(58) Field of Classification Search
CPC ........ H01S 5/0687; H01S 5/0261; H01S 5/12; H01S 5/22; H01S 5/0265; H01S 5/50
See application file for complete search history.

(56) References Cited

U.S. PATENT DOCUMENTS

| 5,565,693 A | * | 10/1996 | Sasaki | ..................... H01S 5/026 257/14 |
| 2003/0063646 A1 | * | 4/2003 | Yoshida | ..................... H01S 5/50 372/50.22 |

(Continued)

FOREIGN PATENT DOCUMENTS

JP            64-077187 A        3/1989

*Primary Examiner* — Kinam Park
(74) *Attorney, Agent, or Firm* — Studebaker & Brackett PC (57) ABSTRACT

An optical module includes: a semiconductor laser emitting laser light; an optical device having a butt joint interface; an optical amplifier amplifying the laser light passed through the optical device; an equivalent resonator length adjustor inserted between the optical amplifier and the optical device; a wavelength spectrum measuring device measuring a wavelength of light output from the optical amplifier; and a refractive index adjustment circuit controlling a current applied to the equivalent resonator length adjustor based on a result of measurement performed by the wavelength spectrum measuring device to adjust a refractive index of the equivalent resonator length adjustor. Parasitic oscillation light in a plurality of Fabry-Perot modes is generated as the butt joint interface is one of reflection ends. The refractive index adjustment circuit adjusts the refractive index so that none of peak wavelengths of the parasitic oscillation light coincides with an oscillation wavelength of the semiconductor laser.

7 Claims, 6 Drawing Sheets

(51) Int. Cl.
*H01S 5/50* (2006.01)
*H01S 5/0625* (2006.01)

(56) References Cited

U.S. PATENT DOCUMENTS

| | | | | |
|---|---|---|---|---|
| 2003/0072342 A1* | 4/2003 | Yoshida | ................ | B82Y 20/00 |
| | | | | 372/46.01 |
| 2004/0048406 A1* | 3/2004 | Ikeda | .................... | B82Y 20/00 |
| | | | | 438/29 |
| 2013/0235892 A1* | 9/2013 | Ushinsky | ............. | H01S 3/0627 |
| | | | | 372/36 |

* cited by examiner

OPTICAL MODULE

BACKGROUND OF THE INVENTION

Field

The present invention relates to an optical module and, particularly, to an optical module incorporating a semiconductor optical device in which a semiconductor laser and an optical amplifier are monolithically integrated.

Background

As a light source in an optical fiber communication system such as a 10G-Ethernet passive optical network (10G-EPON), an optical module incorporating an electroabsorption optical modulator integrated DFB laser is used (see, for example, JP 64-77187 A). In the optical module, laser light emitted from the semiconductor laser is modulated with an optical modulator. In a case where a type of optical modulator which intermittently absorbs light is used for this modulation, the output of modulated light is as small as about 0 to 10 dBm and is thus insufficient as an output from an optical line terminal (OLT) light source for a PON. The modulated light is therefore amplified to about 16 dBm with a semiconductor optical amplifier monolithically integrated in a chip before the light is input to an optical fiber. The optical modulator and the optical amplifier are joined to each other by using a butt joint method, and an interface therebeween is a butt joint interface.

Parasitic oscillation light in Fabry-Perot modes is generated between the emission end surface of the optical amplifier and the butt joint interface. This parasitic oscillation light enters the semiconductor laser and disturbs a carrier concentration distribution in the substantially same wavelength semiconductor laser. The oscillation light spectral line width of the semiconductor laser is thereby increased, causing phase noise at the time of optical fiber transmission and, hence, degradation in transmission characteristics.

SUMMARY

In view of the above-described problem, an object of the present invention is to provide a high-output optical module in which the influence of parasitic oscillation light on a semiconductor laser is small.

According to the present invention, an optical module includes: a semiconductor laser emitting laser light; an optical device having a butt joint interface; an optical amplifier amplifying the laser light passed through the optical device; an equivalent resonator length adjustor inserted between the optical amplifier and the optical device; a wavelength spectrum measuring device measuring a wavelength of light output from the optical amplifier; and a refractive index adjustment circuit controlling a current applied to the equivalent resonator length adjustor based on a result of measurement performed by the wavelength spectrum measuring device to adjust a refractive index of the equivalent resonator length adjustor, wherein parasitic oscillation light in a plurality of Fabry-Perot modes is generated as the butt joint interface is one of reflection ends, and the refractive index adjustment circuit adjusts the refractive index of the equivalent resonator length adjustor so that none of peak wavelengths of the parasitic oscillation light coincides with an oscillation wavelength of the semiconductor laser.

In the present invention, the refractive index of the equivalent resonator length adjustor inserted between the optical amplifier and the electro-absorption optical modulator is adjusted so that none of the plurality of peak wavelengths of the parasitic oscillation light coincides with the oscillation wavelength of the semiconductor laser. The optical module can thus be obtained as a high-output optical module in which the influence of parasitic oscillation light on the semiconductor laser is small.

Other and further objects, features and advantages of the invention will appear more fully from the following description.

DESCRIPTION OF EMBODIMENTS

An optical module according to the embodiments of the present invention will be described with reference to the drawings. The same components will be denoted by the same symbols, and the repeated description thereof may be omitted.

First Embodiment

Figure 1:
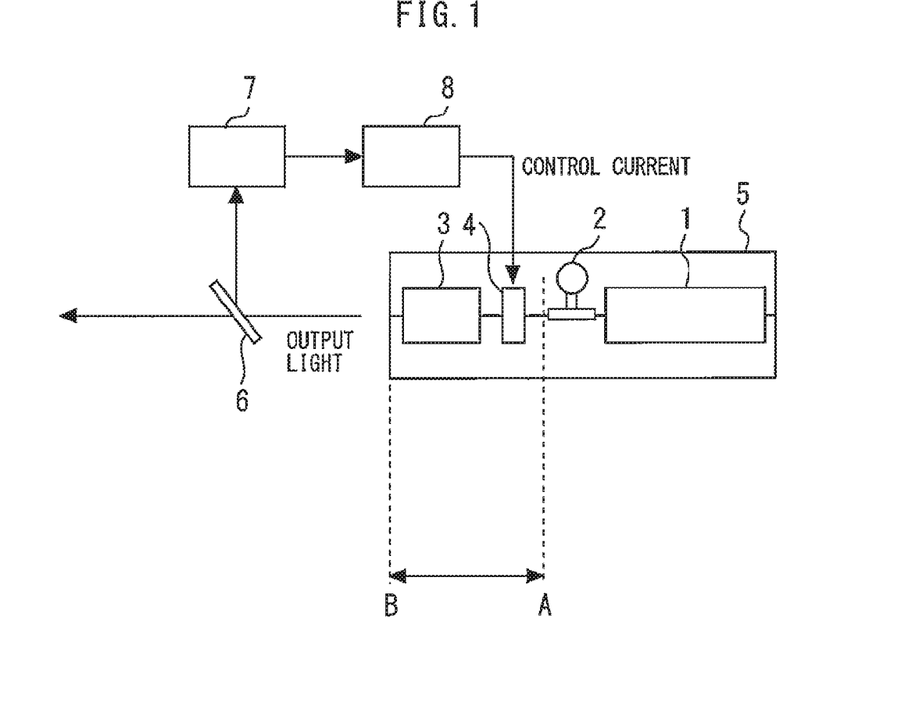
FIG. 1 is a plan view of an optical module according to a first embodiment of the present invention.

FIG. 1 is a plan view of an optical module according to a first embodiment of the present invention. A semiconductor laser 1 (distributed feedback laser diode: DFB-LD) emits laser light. An electro-absorption optical modulator 2 (electro-absorption modulator: EAM) modulates the laser light emitted from the semiconductor laser 1. An optical amplifier 3 (semiconductor optical amplifier: SOA) amplifies the laser light exited from the electro-absorption optical modulator 2. An equivalent resonator length adjustor 4 is inserted between the optical amplifier 3 and the electro-absorption optical modulator 2. These semiconductor devices are formed on one semiconductor substrate 5, and each adjacent pair of the semiconductor devices are joined to each other by a butt joint.

An optical branch part 6 divides the light emitted from the optical amplifier 3 into two beams, one of which is input to a wavelength spectrum measuring device 7. The wavelength spectrum measuring device 7 measures the wavelength of the light output from the optical amplifier 3. A refractive index adjustment circuit 8 controls a current applied to the equivalent resonator length adjustor 4 on the basis of the result of measurement performed by the wavelength spectrum measuring device 7 to adjust the refractive index of the equivalent resonator length adjustor 4 by a plasma effect based on the accumulation of carriers.

Figure 2:
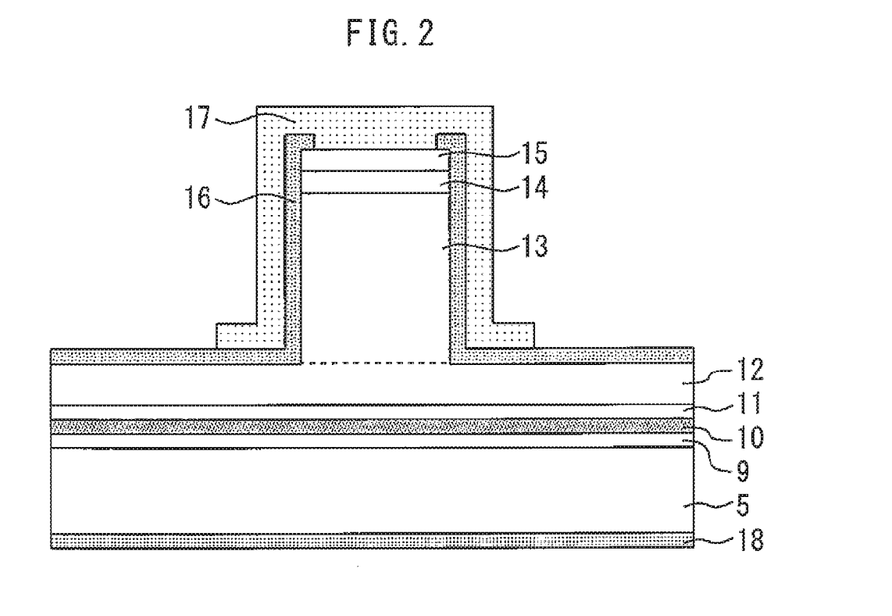
FIG. 2 is a sectional view of the semiconductor laser according to the first embodiment of the present invention.

FIG. 2 is a sectional view of the semiconductor laser according to the first embodiment of the present invention.

A light confinement layer 9, an active layer 10, a light confinement layer 11, p-InP cladding layers 12 and 13, a p-InGaAsP BDR layer 14 and a p-InGaAs contact layer 15 are successively laminated on the semiconductor substrate 5 made of n-InP. The light confinement layers 9 and 11 are, for example, InGaAsP or InGaAlAs bulk layers.

The p-InP cladding layer 13, the p-InGaAsP BDR layer 14 and the p-InGaAs contact layer 15 are formed into the shape of a ridge, and side surfaces of the ridge are covered with passivation film 16 made of $SiO_2$, SiN or Si. A front surface electrode 17 is connected to the p-InGaAs contact layer 15, while a back surface electrode 18 is connected to a back surface of the semiconductor substrate 5. The semiconductor laser 1 is of a ridge type, as described above, and each of the electro-absorption optical modulator 2, the optical amplifier 3 and the equivalent resonator length adjustor 4 is also of a ridge type.

Figure 3:
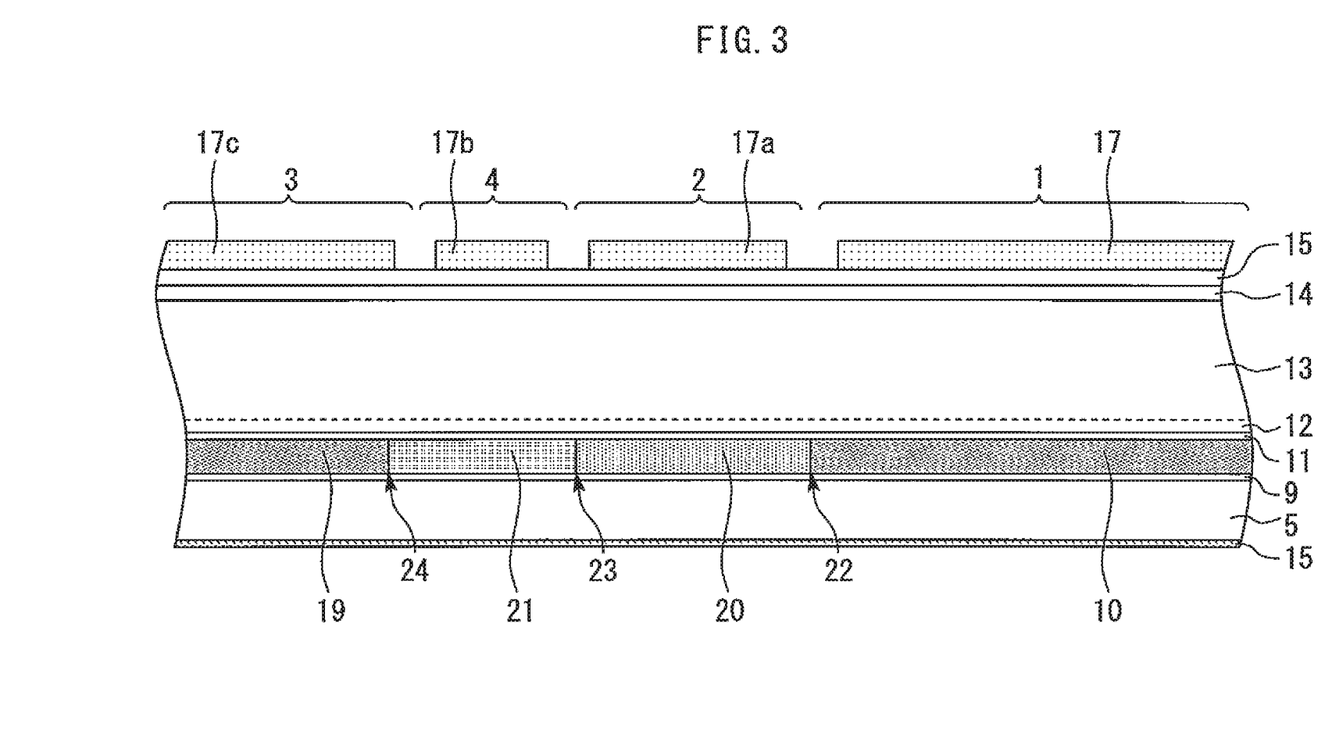
FIG. 3 is a sectional view along the waveguide direction of the optical module according to the first embodiment of the present invention.

FIG. 3 is a sectional view along the waveguide direction of the optical module according to the first embodiment of the present invention. Front surface electrodes 17, 17a, 17b, and 17c of the semiconductor laser 1, the electro-absorption optical modulator 2, the equivalent resonator length adjustor 4 and the optical amplifier 3 are provided separately from each other and voltages are separately applied to these front surface electrodes. Each of the active layer 10 of the semiconductor laser 1 and an active layer 19 of the optical amplifier 3 is an InGaAsP or AlGaInAs quantum well capable of producing an optical gain under current injection. A light absorption layer 20 of the electro-absorption optical modulator 2 is an AlGaInAs or InGaAsP quantum well. An optical waveguide layer 21 of the equivalent resonator length adjustor 4 is an AlGaInAs or InGaAsP quantum well or a single layer.

The DFB oscillation wavelength $\lambda_{DFB}$ of the semiconductor laser 1 is one of 1250 to 1350 nm, 1450 to 1500 nm, 1530 to 1560 nm and 1560 to 1620 nm. The photoluminescence wavelength $\lambda_{LD}$ of the active layers 10 and 19 is in a range from ($\lambda_{DFB}$−20 nm) to ($\lambda_{DFB}$+20 nm). The photoluminescence wavelength $\lambda_{EA}$ of the light absorption layer 20 is equal to or shorter than ($\lambda_{DFB}$−50 nm). The photoluminescence wavelength $\lambda_{WG}$ of the optical waveguide layer 21 is equal to or shorter than $\lambda_{EA}$.

A butt joint interface 22 is formed between the active layer 10 of the semiconductor laser 1 and the light absorption layer 20 of the electro-absorption optical modulator 2. A butt joint interface 23 is formed between the light absorption layer 20 of the electro-absorption optical modulator 2 and the optical waveguide layer 21 of the equivalent resonator length adjustor 4. A butt joint interface 24 is formed between the optical waveguide layer 21 of the equivalent resonator length adjustor 4 and the active layer 19 of the optical amplifier 3.

Parasitic oscillation light in a plurality of Fabry-Perot modes is generated between an emission end surface of the optical amplifier 3 and the butt joint interface 23 of the electro-absorption optical modulator 2 (between A and B in FIG. 1). The refractive index adjustment circuit 8 adjusts the refractive index of the equivalent resonator length adjustor 4 so that none of the plurality of peak wavelengths of the parasitic oscillation light coincides with the oscillation wavelength of the semiconductor laser 1.

Peak wavelengths λ of the Fabry-Perot modes are given by equation 1:

$$(\lambda/2)*m=n_{eff}*L+(n_{eff}+\Delta n_{eff})*\Delta L \quad \text{(Equation 1)}$$

where m is a natural number; $n_{eff}$ is the equivalent refractive index of the optical amplifier 3; $\Delta n_{eff}$ is an amount of change in refractive index of the equivalent resonator length adjustor 4; L is the length of the optical amplifier 3; and ΔL is the length of the equivalent resonator length adjustor 4.

An optimum adjustment value of $\Delta n_{eff}$ is given by equation 2:

$$(\lambda_{DFB}/2)*(m+\alpha)=n_{eff}*L+(n_{eff}+\Delta n_{eff})*\Delta L \quad \text{(Equation 2)}$$

where α=±1/2.

Figure 4:
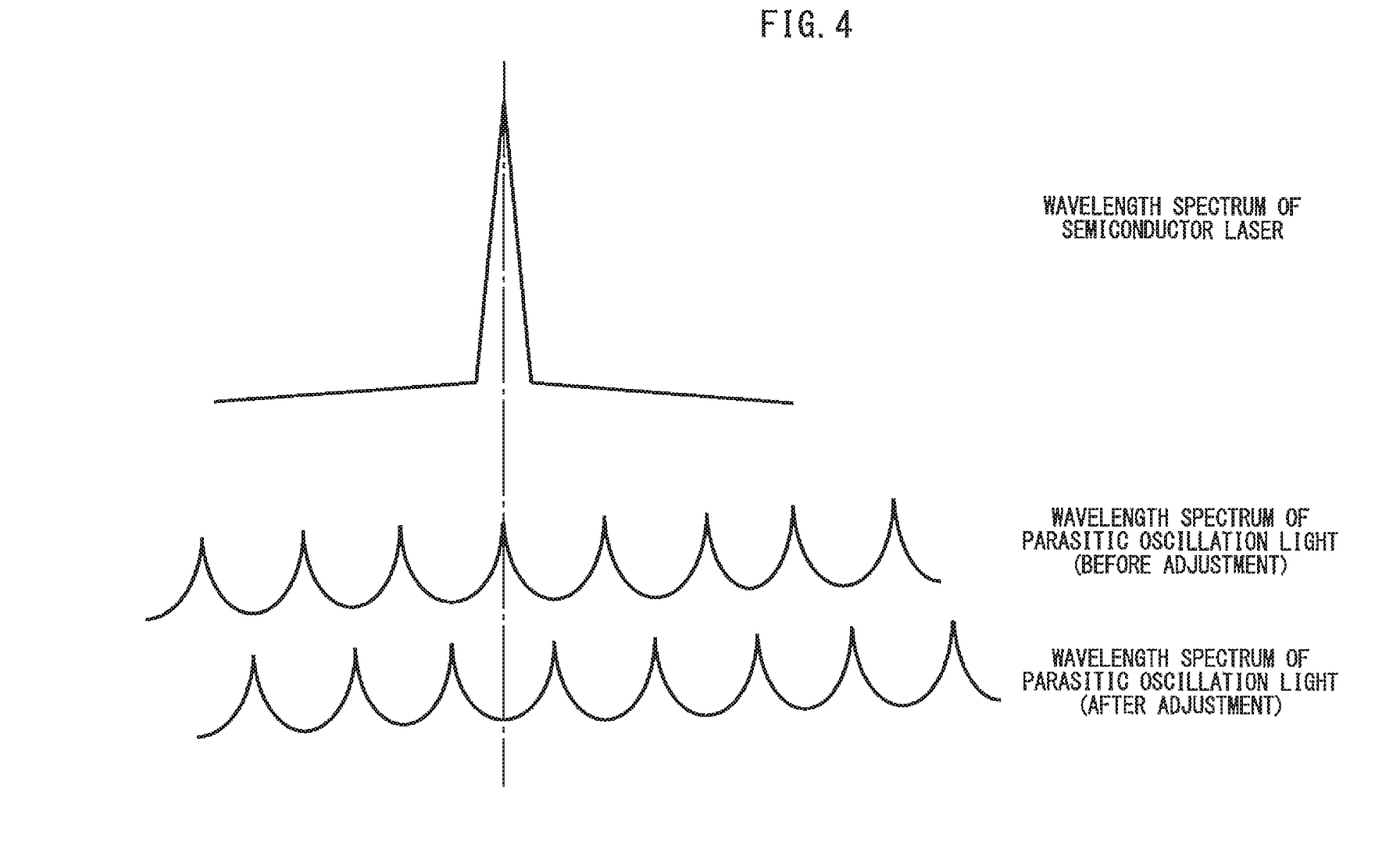
FIG. 4 is a diagram showing the relationship between the wavelength spectrum of the semiconductor laser and the wavelength spectra of the parasitic oscillation light before and after adjustment.

FIG. 4 is a diagram showing the relationship between the wavelength spectrum of the semiconductor laser and the wavelength spectra of the parasitic oscillation light before and after adjustment. If α is not an integer, none of the peak wavelengths of the Fabry-Perot modes coincides with the oscillation wavelength of the semiconductor laser 1.

In the present embodiment, as described above, the refractive index of the equivalent resonator length adjustor 4 inserted between the optical amplifier 3 and the electro-absorption optical modulator 2 is adjusted so that none of the plurality of peak wavelengths of the parasitic oscillation light coincides with the oscillation wavelength of the semiconductor laser 1. The optical module can thus be obtained as a high-output optical module in which the influence of parasitic oscillation light on the semiconductor laser 1 is small.

The current applied from the refractive index adjustment circuit 8 to the equivalent resonator length adjustor 4 is in the forward direction with respect to the pn junction of the equivalent resonator length adjustor 4. Therefore no light absorption due to the electro-absorption effect occurs.

Second Embodiment

Figure 5:
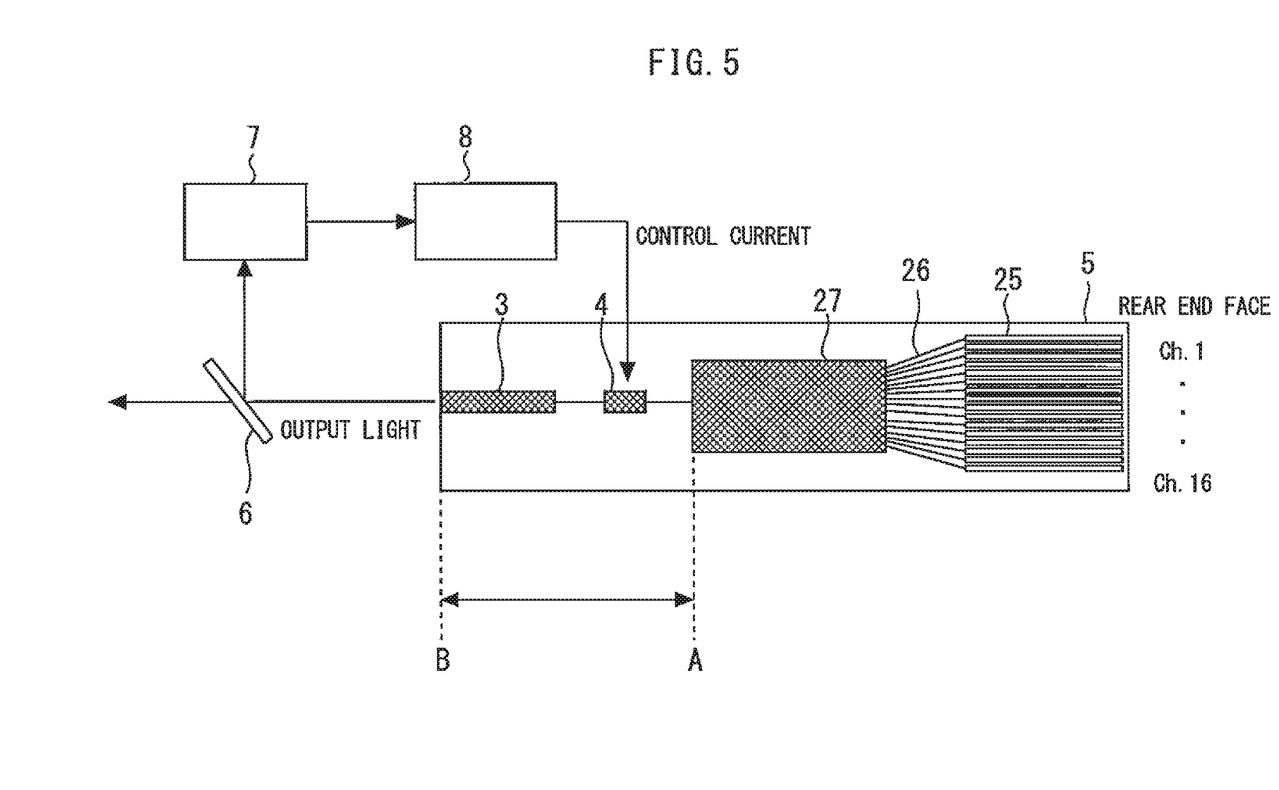
FIG. 5 is a plan view of an optical module according to a second embodiment of the present invention.

FIG. 5 is a plan view of an optical module according to a second embodiment of the present invention. An LD array 25 is provided in place of the semiconductor laser 1 in the first embodiment, and an optical waveguide 26 and an optical multiplexer 27 are provided in place of the electro-absorption optical modulator 2. Laser beams respectively emitted from a plurality of wavelength variable DFB-LDs in the LD array 25 are led to the optical multiplexer 27 by the optical waveguide 26 to be combined.

Parasitic oscillation light in a plurality of Fabry-Perot modes is generated between A and B in FIG. 5, same as in the first embodiment. The refractive index of the equivalent resonator length adjustor 4 is adjusted with respect to the parasitic oscillation light in the same way as in the first embodiment. As a result, the same advantage as that of the first embodiment can be obtained.

Third Embodiment

Figure 6:
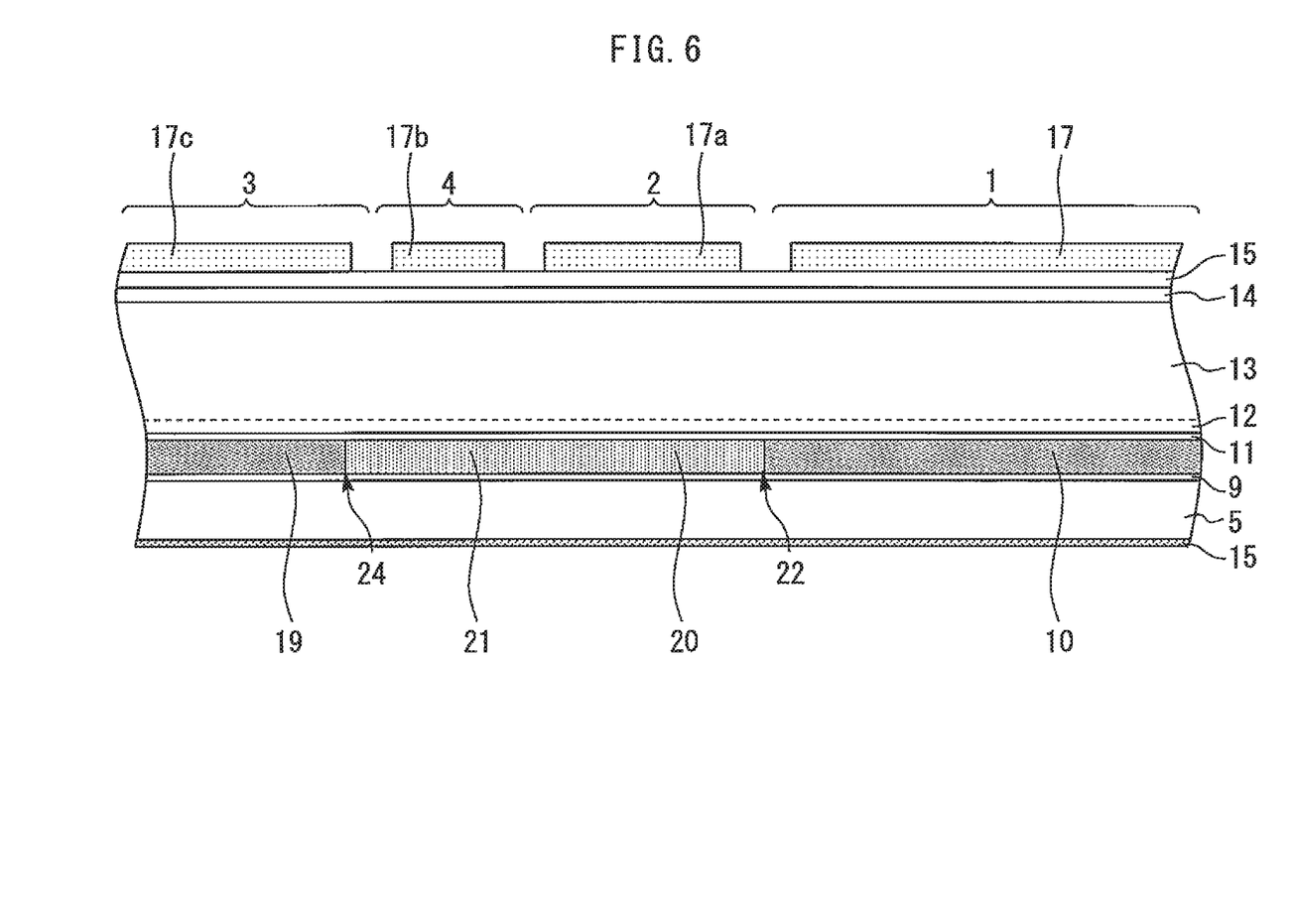
FIG. 6 is a sectional view of an optical module according to a third embodiment of the present invention, taken along the waveguide direction.

FIG. 6 is a sectional view of an optical module according to a third embodiment of the present invention, taken along the waveguide direction. The optical waveguide layer 21 of the equivalent resonator length adjustor 4 is formed by the same crystal growth step as that for forming the light absorption layer 20 of the electro-absorption optical modulator 2. The optical waveguide layer 21 and the light absorption layer 20 are made of the same material and made equal in thickness to each other. The other components are the same as those in the first embodiment.

The manufacturing process is simplified thereby and the same advantage as that of the first embodiment can also be obtained. The active layer 10 of the semiconductor laser 1 and the active layer 19 of the optical amplifier 3 may be formed in the same crystal growth step. In such a case, these layers are made of the same material and made equal in thickness to each other.

Fourth Embodiment

Figure 7:
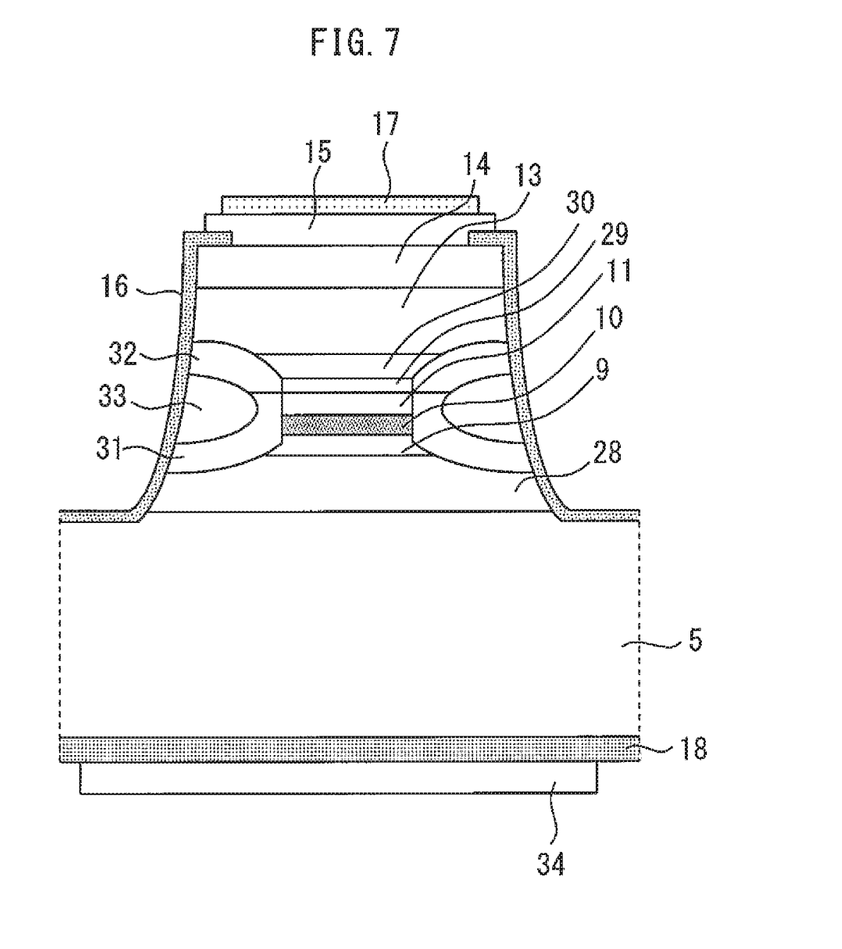
FIG. 7 is a sectional view of a semiconductor laser according to a fourth embodiment of the present invention.

FIG. 7 is a sectional view of a semiconductor laser according to a fourth embodiment of the present invention. An n-InP buffer layer 28, a light confinement layer 9, an active layer 10, a light confinement layer 11, a diffraction grating layer 29 and a p-InP cladding layer 30 are successively laminated on a semiconductor substrate 5 made of n-InP. Opposite sides of the active layer 10 are embedded with Fe-doped InP current block layers 31 and 32 and an n-InP current block layer 33. On these layers, a p-InP cladding layer 13, a p-InGaAsP BDR layer 14 and a p-InGaAs contact layer 15 are successively laminated. Side surfaces of the multilayer structure thus formed are covered with a passivation film 16. A front surface electrode 17 is connected to the p-InGaAs contact layer 15, while a back surface electrode 18 is connected to a back surface of the semiconductor substrate 5. A back surface plating layer 34 is formed on the back surface electrode 18.

The semiconductor laser 1 is of a buried hetero type, as described above, and each of the electro-absorption optical modulator 2, the optical amplifier 3 and the equivalent resonator length adjustor 4 is also of a buried hetero type. The other components are the same as those in the first embodiment. Also in the case of using such a buried hetero type, the same advantage as that of the first embodiment can be obtained.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2016-077037, filed on Apr. 7, 2016 including specification, claims, drawings and summary, on which the Convention priority of the present application is based, is incorporated herein by reference in its entirety.

The invention claimed is:

1. An optical module comprising:
   a semiconductor laser emitting laser light;
   an optical device having a butt joint interface;
   an optical amplifier amplifying the laser light passed through the optical device;
   an equivalent resonator length adjustor inserted between the optical amplifier and the optical device;
   a wavelength spectrum measuring device measuring a wavelength of light output from the optical amplifier; and
   a refractive index adjustment circuit controlling a current applied to the equivalent resonator length adjustor based on a result of measurement performed by the wavelength spectrum measuring device to adjust a refractive index of the equivalent resonator length adjustor,
   wherein parasitic oscillation light in a plurality of Fabry-Perot modes is generated as the butt joint interface is one of reflection ends, and
   the refractive index adjustment circuit adjusts the refractive index of the equivalent resonator length adjustor so that none of peak wavelengths of the parasitic oscillation light coincides with an oscillation wavelength of the semiconductor laser.

2. The optical module according to claim 1, wherein a current applied from the refractive index adjustment circuit to the equivalent resonator length adjustor is in a forward direction with respect to a pn junction of the equivalent resonator length adjustor.

3. The optical module according to claim 1, wherein the optical device is one of an electro-absorption optical modulator, an optical waveguide and an optical multiplexer.

4. The optical module according to claim 1, wherein an optical waveguide layer of the equivalent resonator length adjustor and a core layer of the optical device are made of same material and made equal in thickness to each other.

5. The optical module according to claim 1, wherein an active layer of the optical amplifier and an active layer of the semiconductor laser are made of same material and made equal in thickness to each other.

6. The optical module according to claim 1, wherein each of the semiconductor laser, the optical device, the optical amplifier and the equivalent resonator length adjustor is of a ridge type.

7. The optical module according to claim 1, wherein each of the semiconductor laser, the optical device, the optical amplifier and the equivalent resonator length adjustor is of a buried hetero type.

* * * * *